United States Patent
Chang et al.

(10) Patent No.: US 9,053,795 B2
(45) Date of Patent: Jun. 9, 2015

(54) SOLID STATE DRIVE ENCOUNTERING POWER FAILURE AND ASSOCIATED DATA STORAGE METHOD

(71) Applicant: Lite-On Technology Corporation, Taipei (TW)

(72) Inventors: Kun-Chang Chang, Hsinchu (TW); Chih-Wei Yeh, Hsinchu (TW); Wei-Han Lee, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 54 days.

(21) Appl. No.: 14/025,925

(22) Filed: Sep. 13, 2013

(65) Prior Publication Data
US 2014/0269056 A1 Sep. 18, 2014

(30) Foreign Application Priority Data
Mar. 12, 2013 (CN) .......................... 2013 1 0077807

(51) Int. Cl.
| | |
|---|---|
| *G11C 16/10* | (2006.01) |
| *G11C 16/34* | (2006.01) |
| *G11C 11/56* | (2006.01) |
| *G11C 16/30* | (2006.01) |
| *G11C 5/14* | (2006.01) |
| *G11C 7/08* | (2006.01) |
| *G11C 7/24* | (2006.01) |
| *G11C 11/4074* | (2006.01) |
| *G11C 7/10* | (2006.01) |
| *G11C 29/02* | (2006.01) |

(52) U.S. Cl.
CPC ........ *G11C 16/10* (2013.01); *G11C 2211/5641* (2013.01); *G11C 11/5628* (2013.01); *G11C 7/1006* (2013.01); *G11C 5/147* (2013.01); *G11C 29/028* (2013.01)

(58) Field of Classification Search
CPC .................. G11C 11/5628; G11C 2211/5641; G11C 5/147; G11C 29/028; G11C 7/1006
USPC ................................ 365/185.03, 189.07, 226
See application file for complete search history.

(56) References Cited

U.S. PATENT DOCUMENTS

| | | | | |
|---|---|---|---|---|
| 2013/0124888 | A1* | 5/2013 | Tanaka et al. | 713/320 |
| 2014/0006688 | A1* | 1/2014 | Yu et al. | 711/103 |
| 2014/0013038 | A1* | 1/2014 | Hsiao | 711/103 |

* cited by examiner

*Primary Examiner* — Ly D Pham
(74) *Attorney, Agent, or Firm* — WPAT, PC; Justin King (57) ABSTRACT

A solid state drive and its associated data storage method are provided. The data storage method comprising steps of: receiving data-for-writing from a host, and transforming the data-for-writing to data-for-storage; comparing a supply voltage and a predetermined voltage; and when the supply voltage is lower than the predetermined voltage, proceeding a strong-page programming procedure for storing the data-for-storage to a blank area of a multi-level cell flash memory.

8 Claims, 5 Drawing Sheets

SOLID STATE DRIVE ENCOUNTERING POWER FAILURE AND ASSOCIATED DATA STORAGE METHOD

This application claims the benefit of People's Republic of China Application Serial No. 201310077807.0, filed Mar. 12, 2013, the subject matter of which is incorporated herein by reference.

FIELD OF THE INVENTION

The present invention relates to a data storage drive and associated data storage method thereof, and more particularly to a solid state drive encountering power failure and associated data storage method.

BACKGROUND OF THE INVENTION

As is well known, a solid state drive (hereinafter, SSD) is a data storage drive that uses NAND flash memories to store data. Solid state drive with NAND flash memories is a non-volatile memory device. After being written to the non-volatile memory, the data are retained in the solid state drive even if power supply system is off.

Each memory cell in the flash memories comprises a single transistor with an additional floating gate called floating gate transistor. During programming cycle, hot carriers are injected to the floating gate transistor. According to the amount of hot carriers being injected to the floating gate, threshold voltage of the floating gate transistor changes, so as storage status of the memory cell. During erasing cycle, hot carriers are ejected from the floating gate transistor.

Flash memories can be classified according to internal design of their memory cells. For instance, a flash memory may be a single-level cell (hereinafter, SLC), or multi-level cell (hereinafter, MLC) such as double-level cell, triple-level cell, quadruple-level cell etc.

SLC flash memory is expensive but with faster performance and greater reliability. SLC flash memory can be erased for dozens of thousand times, but SLC flash memory stores only one bit value per cell. Relatively, a triple-level cell flash memory is with slow performance but cost less. Erasing endurance of the triple-level cell flash memory is less than a thousand times, and the triple-level cell flash memory stores 3 bits value per cell. Performance, cost, and endurance characteristics of the double-level cell flash memory are in-between of those of the SLC flash memory and the triple-level cell flash memory. Erasing endurance of the double-level cell flash memory is between 1000 to 5000 times, and the double-level cell flash memory stores 2 bits value per cell.

In other words, storage density of triple-level cell flash memory is relatively higher, and that of the SLC flash memory is relatively is lower.

Figure 1:
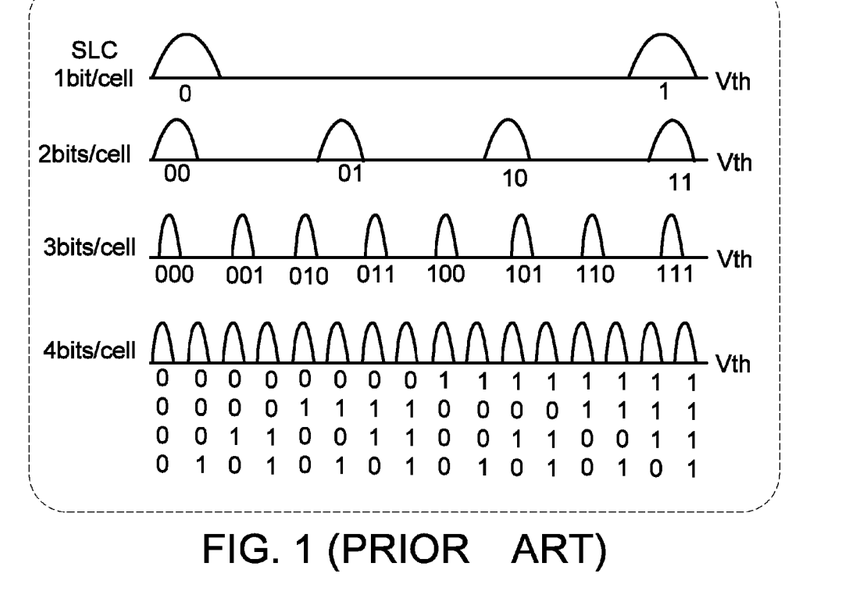
FIG. 1 is a schematic diagram illustrating relations between the threshold voltage distributions and storage states of various flash memories.

FIG. 1 is a schematic diagram illustrating relations between the threshold voltage distributions and storage states of various flash memories. The SLC flash memory stores one bit of data per cell (1 bit/cell). Hence, according to the amount of hot carriers being injected, two distinct distributions of threshold voltage may be generated at the floating gate transistor in memory cell of SLC flash memory. Each distribution of the threshold voltage represents a storage state. For instance, assuming that a memory cell is at a storage state "state-0" when the memory cell is with low threshold voltage, and at a storage state "state-1" when the memory cell is with high threshold voltage. The storage states "state-0" and "state-1" represent two different storage states. In some cases, a first storage state and a second storage state may be used to represent two distinct distributions of threshold voltage.

Similarly, the double-level cell flash memory stores 2-bits of data per cell (2 bits/cell). Hence, according to the amount of hot carriers being injected, four distinct distributions of the threshold voltage may be generated at the floating gate transistor in memory cell of the double-level cell flash memory. These four distributions are used for representing four different storage states. For example, assuming that voltage levels of threshold voltages ranging from low to high are corresponding to the following storage states, "state-00", "state-01", "state-10", and "state-11", respectively.

The triple-level cell flash memory stores 3-bits of data per cell (3 bits/cell). According to the amount of hot carriers being injected, eight distinct distributions of the threshold voltage may be generated at the floating gate transistor in memory cell of the triple-level cell flash memory. These eight distributions are used for representing eight different storage states. For example, assuming that voltage levels of threshold voltages ranging from low to high are corresponding to the following storage states, "state-000", "state-001", "state-010", "state-011", "state-100", "state-101", "state-110", and "state-111", respectively.

The quadruple-level cell flash memory stores 4-bits of data per cell (4 bits/cell). According to the amount of hot carriers being injected, sixteen distinct distributions of the threshold voltage may be generated at the floating gate transistor in memory cell of the quadruple-level cell flash memory. These sixteen distributions are used for representing sixteen different storage states. For example, assuming that voltage levels of threshold voltages ranging from low to high are corresponding to the following storage states, "state-0000", "state-0001", "state-0010", "state-0011", "state-0100", "state-0101", "state-0110", "state-0111", "state-1000", "state-1001", "state-1010", "state-1011", "state-1100", "state-1101", "state-1110", and "state-1111", respectively.

Based on the above illustrations, during programming cycle, storage state and threshold voltage of the flash memory cell will change when the amount of hot carriers being injected changes. SLC flash memory requires only one programming procedure for changing to the demand storage state. However, in order to change to a demand storage state, multiple programming procedures are required for the MLC flash memories.

Figure 2A:
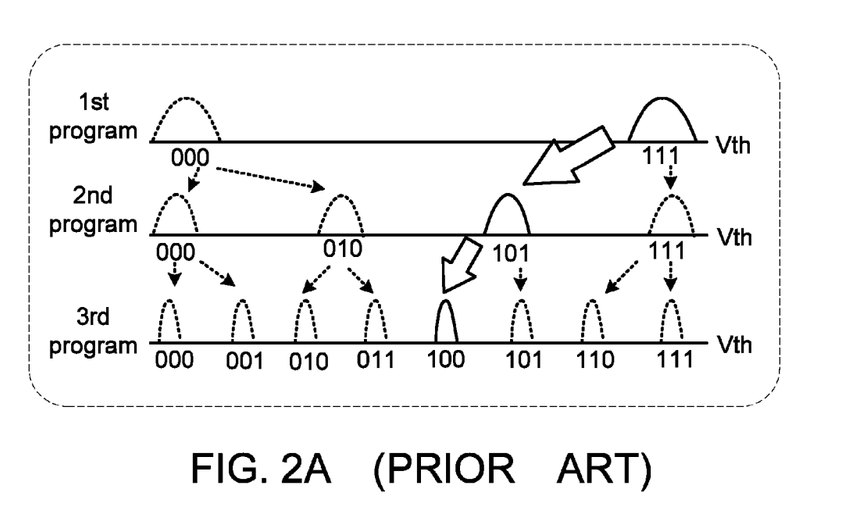
FIG. 2A is a schematic diagram illustrating control flow of programming the triple-level cell flash memory to the storage state "state-100"

Details of the triple-level cell flash memory will be illustrated for example. FIG. 2A is a schematic diagram illustrating control flow of programming the triple-level cell flash memory to the storage state "state-100". It is assumed that three programming procedures are required for programming the triple-level cell flash memory to the storage state "state-100".

During the first programming procedure, a first program voltage is provided, for changing the storage state of the memory cell to the storage state "state-111". Consequently, during the second programming procedure, a second program voltage is provided, for changing the storage state of the memory cell to the storage state "state-101". At the end, during the third procedure, a third program voltage is provided, for changing the storage state of the memory cell to the storage state "state-100".

That is, a final storage state is required to be known in advance, then the three programming procedures can be determined. Dotted lines in FIG. 2A are used for illustrating how to program the triple-level cell flash memory to the storage state "state-011". A complete programming procedure includes a first programming procedure of changing the storage state of the memory cell to the storage state "state- 000", a second programming procedure of changing the storage state of the memory cell to the storage state "state-010", and a third programming procedure of changing the storage state of the memory cell to the storage state "state-011". Details of programming procedure regarding how to control the triple-level memory cell to change to other storage states are similar to the ones in FIG. 2A, and are not redundantly described herein.

According to the illustrations above, the memory cell of the triple-level cell flash memory can be programmed to only two distinct storage states after the first programming procedure, four distinct storage states after the second programming procedure, and eight distinct storage states after the third programming procedure. In other words, three programming procedures are required for achieving eight distinct storage states of the triple-level cell flash memory.

Figure 2B:
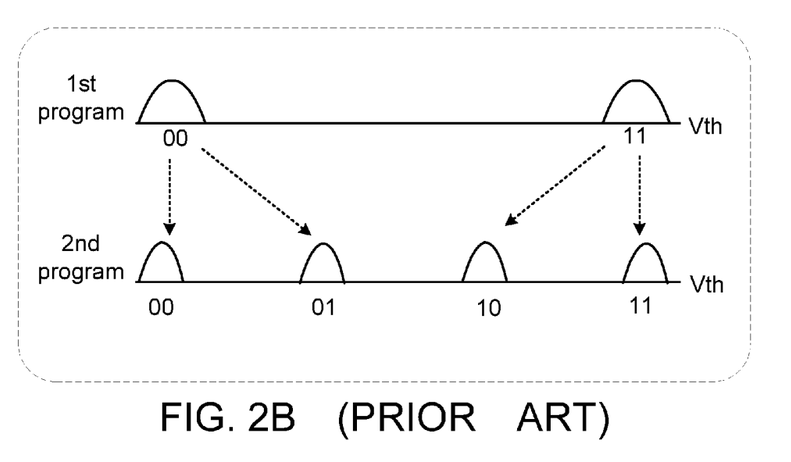
FIG. 2B is a schematic diagram illustrating control flow of programming the double-level cell flash memory to various storage states.

As shown in FIG. 2B, two programming procedures are required for achieving four distinct storage states of the double-level cell flash memory. Similarly, four programming procedures are required for the quadruple-level cell flash memory.

Moreover, programming duration for each programming procedure of the MLC flash memory may vary, and the triple-level cell flash memory is illustrated as an example. The first programming procedure of the triple-level cell flash memory costs about 1 ms, the second programming procedure costs more than 2.5 ms, and the third programming procedure costs about 7.0 ms. Basically, the first programming procedure is the shortest, and the third programming procedure is the longest.

In short, the more voltage levels exist in the MLC flash memory, the more programming procedures are required to change the storage state of the MLC flash memory. Besides, the whole programming duration will be longer. Furthermore, duration of the first programming procedure is the shortest while duration of the last programming procedure is the longest.

Figure 3:
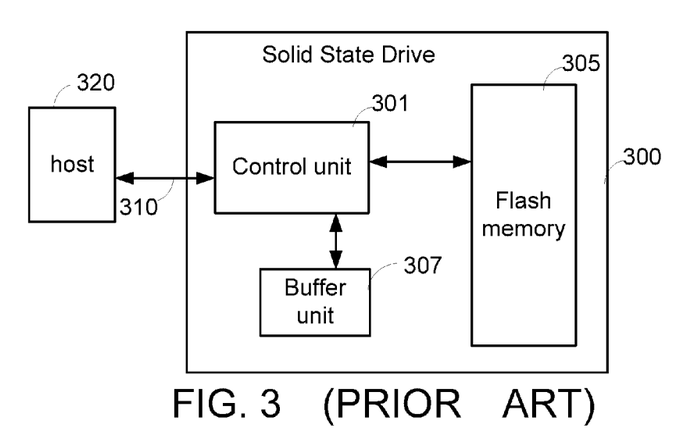
FIG. 3 is a schematic diagram illustrating a conventional solid state drive.

FIG. 3 is a schematic diagram illustrating a conventional solid state drive. The solid state drive 300 includes a control unit 301, a buffer unit 307, and a flash memory 305. The control unit 301 is electrically connected to the buffer unit 307 and the flash memory 305. Moreover, an external bus 310 is used for transmitting data between the control unit 301 and the host 320. Basically, when the host 320 issues data-for-writing to the flash memory 305, the control unit 301 first starts to proceed an ECC encoding procedure. After the ECC encoding procedure, the data-for-writing are transformed to data-for-storage, which are temporarily stored in the buffer unit 307. Afterwards, the control unit 301 records data-for-storage to the flash memory 305 timely. The buffer unit 307 may be an SRAM or a DRAM. That is, data-for-storage stored in the buffer unit 307 will be lost if the solid state drive 300 encounters power failure. The external bus 310 may be a USB bus, an IEEE 1394 bus, a SATA bus, or the like. The flash memory 305 may be a SLC flash memory, or a MLC flash memory.

It is known that, the control unit 301 of the solid state drive 300 stores data to the flash memory 305 in units of page. Size of each page is defined by the manufacturer of the flash memory 305. For instance, each page may be composed of 2K bytes of data, 4K bytes of data, or 8K bytes of data. The flash memory with size of 4K-byte page is illustrated as an example. Assuming that size of the data-for-storage is 4224 bytes, and the data-for-storage includes user data, encoding data, and other related data. In such case, 4224×8 memory cells are required for programming all the data-for-storage by a SLC flash memory.

Comparing to the SLC flash memory, MLC flash memories are with higher storage densities. Hence, the double-level cell flash memory with 4224×8 memory cells is capable of storing two pages of data. Similarly, the triple-level cell flash memory with 4224×8 memory cells is capable of storing three pages of data. The quadruple-level cell flash memory with 4224×8 cells is capable of storing four pages of data.

Figure 4A:
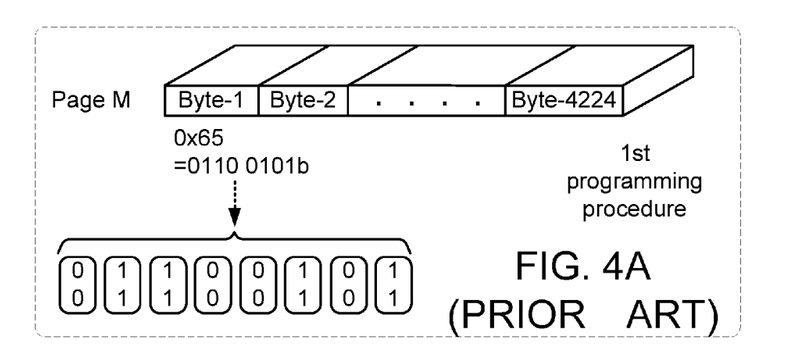
FIG. 4A is a schematic diagram illustrating that two pages are used for data storage to the double-level cell flash memory.
Figure 4B:
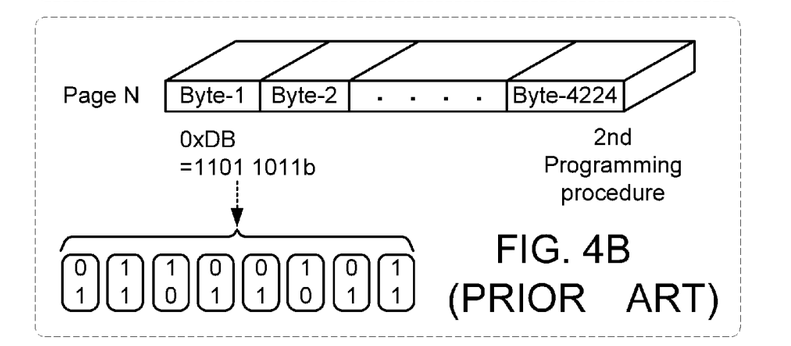
FIG. 4B is a schematic diagram illustrating that two pages are used for data storage to the double-level cell flash memory.

FIGS. 4A and 4B are schematic diagrams illustrating that two pages are used for storing data to the double-level cell flash memory. The first byte (Byte-1) is illustrated as an example. Assuming that data stored at the first byte in page M is 0x65h (01100101b), and data stored at the first byte in page N is 0xDBh (11011011b). As shown in FIG. 4A, during the first programming procedure, data of the first bye in page M (01100101b) is programmed to the 8 memory cells of the double-level cell flash memory. Afterwards, the storage states of the 8 memory cells are changed to "state-00", "state-11", "state-11", "state-00", "state-00", "state-11", "state-00", and "state-11", respectively.

According to FIG. 4B, after the second programming procedure, data of the first byte in page N (11011011b) is programmed to the 8 memory cells of the double-level cell flash memory. Afterwards, the storage states of the 8 memory cells are changed to "state-01", "state-11", "state-10", "state-01", "state-01", "state-10", "state-01", and "state-11", respectively.

Based on above illustrations, the double-level cell flash memory with 4224×8 memory cells stores only data of the first byte in page M. Moreover, for the double-level cell flash memory with 4224×8 memory cells, a second programming procedure is required for storing data of both the first bytes of the page M and the page N.

According to specification of the MLC flash memories, pages being programmed during the first programming procedure are defined as strong-page. Pages being programmed during the second programming procedure are defined as weak-page. Alternatively speaking, programming procedure for strong-page is required to be executed prior to that of the weak-pages. For instance, programming two pages of data costs 3.5 ms (1 ms+2.5 ms) for the double-level cell with 4244×8 memory cells.

Figure 5:
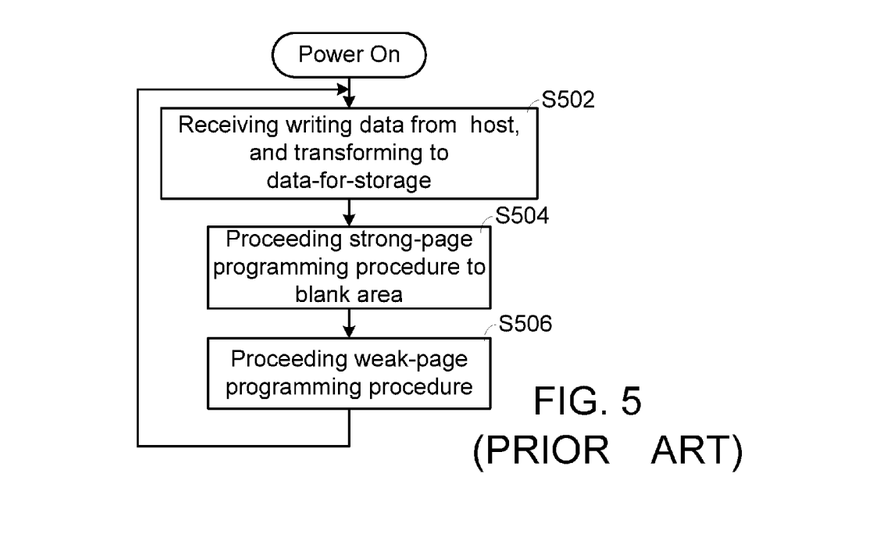
FIG. 5 is a flow diagram illustrating conventional programming procedures for the solid state drive composed of multi-level cell flash memories.

FIG. 5 is a flow diagram illustrating conventional programming procedures for the solid state drive composed of multi-level cell flash memories. After the solid state drive is powered on, the solid state drive receives data-for-writing (writing data) from the host and transforms the data-for-writing to data-for-storage (step S502). Consequently, the solid state drive proceeds a strong-page programming procedure to a blank area of the flash memory (step S504). The strong-page programming procedure is followed by a weak-page programming procedure (step S506). After all programming procedures (step S504 and step S506) are completed, the whole programming operation is done. The solid state drive again executes the step of receiving data-for-writing from the host (step S502), for proceeding programming procedures of other pages. The blank area of the flash memory may be a region without any data, or an erased region.

Moreover, number of the programming procedures for weak-page (S506) is determined by types of the MLC flash memory. For the double-level cell flash memory, only one weak-page programming procedure is required before the step S502 is executed again. For the triple-level cell flash memory, two weak-page programming procedures are required before the step S502 is executed again. For the quadruple-level cell flash memory, three weak-page programming procedures are required before the step S502 is executed again.

According to the control flow shown in FIG. 5, when the power remains on, the control unit of the solid state drive programs data to the MLC flash memory in pages. However, when the solid state drive encounters an unexpected power-failure, the above control flow for programming data takes too much time and may be interrupted. Consequently, the programming procedure may fail, and the programmed data may be incorrect or missing.

SUMMARY OF THE INVENTION

An embodiment of the present invention provides a solid state drive, electrically connected to a host, comprising: a control unit, for receiving data-for-writing from the host, and transforming the data-for-writing to data-for-storage; a buffer unit, for storing the data-for-storage; a multi-level cell flash memory, electrically connected to the control unit; and a voltage detecting unit, for receiving a supply voltage, and issuing an informing signal when the supply voltage is lower than a predetermined voltage, wherein the control unit proceeds a strong-page programming procedure for storing the data-for-storage to a blank area of the multi-level cell flash memory after receiving the informing signal.

Another embodiment of the present invention provides a data storage method for a solid state drive, the data storage method comprising steps of: receiving data-for-writing from a host, and transforming the data-for-writing to data-for-storage; comparing a supply voltage and a predetermined voltage; and when the supply voltage is lower than the predetermined voltage, proceeding a strong-page programming procedure for storing the data-for-storage to a blank area of a multi-level cell flash memory.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 6:
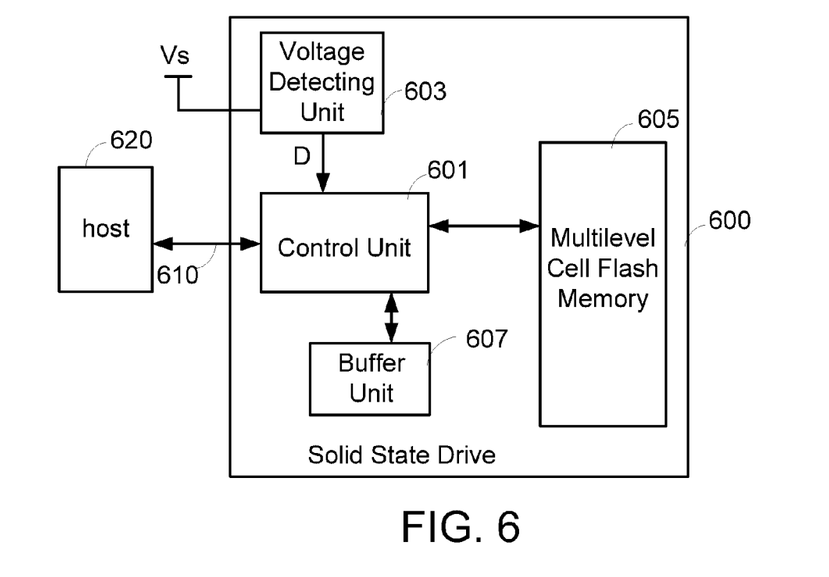
FIG. 6 is a schematic diagram illustrating a solid state drive according to the present disclosure.

FIG. 6 is a schematic diagram illustrating a solid state drive according to the disclosure. The solid state drive 600 includes a control unit 601, a voltage detecting unit 603, a buffer unit 607, and a multi-level cell flash memory 605. The control unit 601 is electrically connected to the buffer unit 607, and the multi-level cell flash memory 605. All components in the solid state storage device 600 operates normally when a supply voltage (Vs) is consistently provided by a power supply system. The power supply system may be an external power supply (not shown), or an internal power supply embedded in the host 620.

Furthermore, an external bus 610 is used for transmitting commands and data between the control unit 601 and the host 620. Basically, when the host 620 provides data-for-writing to the flash memory 605, the control unit 601 first starts to proceed an ECC encoding procedure. After the ECC encoding procedure, the data-for-writing are transformed to data-for-storage, which are temporarily stored in the buffer unit 607. Afterwards, the control unit 601 records data-for-storage to the flash memory 605 timely. The buffer unit 607 may be an SRAM or a DRAM. That is, data stored in the buffer unit 607 will be lost if the solid state drive 600 encounters power failure. The external bus 610 may be a USB bus, an IEEE 1394 bus, a SATA bus, or the like.

According to an embodiment of the present disclosure, the voltage detecting unit 603 receives and detects the supply voltage (Vs). In this embodiment, the control unit 601 and the voltage detecting unit 603 are two separate components. In practical application, the voltage detecting unit 603 may be integrated in the control unit 601, and executes voltage detecting operations similarly.

When the supply voltage (Vs) is lower than a predetermined voltage, the voltage detecting unit 603 correspondingly issues an informing signal (D), and transmits the informing signal (D) to the control unit 601. After receiving the informing signal (D), the control unit 601 executes an emergent programming operation, for programming data-for-storage to the multi-level cell flash memory 605.

In other words, when the supply voltage (Vs) provided by the power supply system is higher than a predetermined voltage (Vdet), the solid state drive 600 programs the data-for-storage to the multi-level cell flash memory 605 with the approach similar to the control flow in FIG. 5. Hence, detail explanations of programming when the supply voltage (Vs) is higher than the predetermined voltage (Vdet) are not redundantly described herein. On the other hand, when the supply power (Vs) provided by the power system is lower than the predetermined voltage (Vdet), the solid state drive 600 correspondingly executes the emergent programming operation. Details of the emergent programming operation are explained below.

Figure 7:
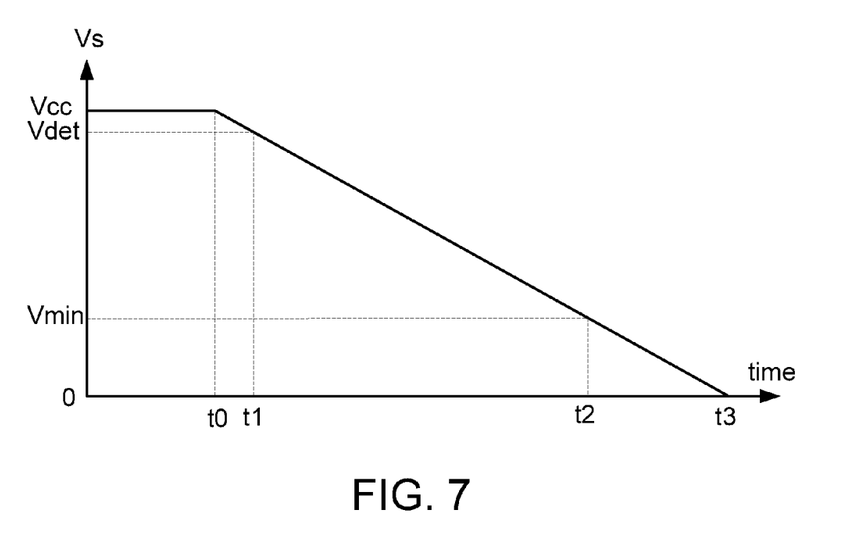
FIG. 7 is a schematic diagram illustrating changes of the supply voltage when the power supply system encounters an unexpected power-failure; and, FIG. 8 is a flow diagram illustrating the programming flow of the solid state drive according to the present invention.

FIG. 7 is a schematic diagram illustrating changes of the supply voltage when the power supply system encounters an unexpected power failure. Before time point t0, supply voltage (Vs) remains at Vcc. Therefore, the solid state drive 600 receives the supply voltage (Vs) and operates in the normal working state. After time point t0, the power supply system is off. Consequently, voltage level of the supply voltage (Vs) starts to drop from Vcc. The supply voltage (Vs) continues to drop and changes to 0 volt at time point t3.

The voltage detecting unit 603 consistently detects the supply voltage (Vs). When the supply voltage (Vs) drops to the predetermined voltage (Vdet) at time point t1, the voltage detecting unit 603 issues the informing signal (D). The informing signal (D) is transmitted to the control unit 601. When the supply voltage Vs drops to a minimum voltage (Vmin) at time point t2, the solid state drive 600 stops its operation.

According to the above illustration, when the power supply system encounters an unexpected power-failure at time point t1, the control unit 601 starts to execute an emergent programming operation according to the informing signal (D). In addition, by time point t2, the control unit 601 is required to program all data-for-storage to the multi-level cell flash memory 605. Otherwise, the data-for-storage in the buffer unit 607 will be missing.

During the procedure of programming data-for-storage, the conventional approach sequentially proceeds the strong-page and the weak-page programming procedures. Hence, when the supply voltage is too low, or stopped being provided, the conventional programming procedure takes too much time for programming data-for-storage to the multi-level cell flash memory. The present invention hence provides an approach to shorten the whole programming duration.

Figure 8:
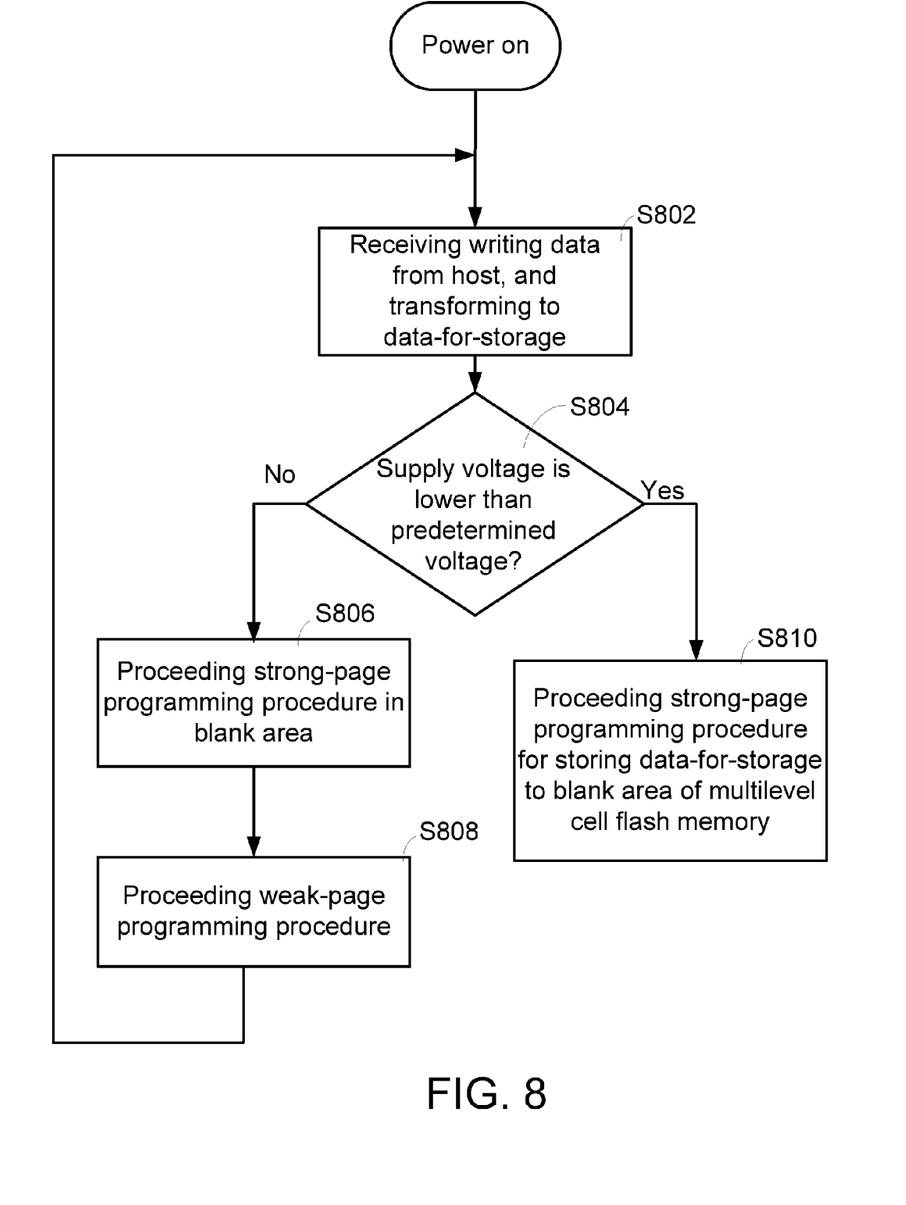

FIG. 8 is a flow diagram illustrating the programming flow of the solid state drive according to the disclosure. When the solid state drive is powered on, writing data transmitted from the host is received and transformed to data-for-storage (step S802). After that, it is detected whether the supply voltage (Vs) is provided (step S804). The voltage detecting unit 603 is used for comparing the supply voltage (Vs) and the predetermined voltage (Vdet). When the supply voltage (Vs) provided by the power supply system drops, the voltage detecting unit 603 is capable of detecting whether the supply voltage (Vs) has been dropped to the predetermined voltage (Vdet).

When the supply voltage (Vs) is constantly provided by the power supply system, the detecting unit 603 detects that the supply voltage (Vs) is higher than the predetermined voltage (Vdet). The programming procedure of the flash memory in the present disclosure at this stage is similar to the conventional ones. That is, a blank area of the multi-level cell flash memory is used for the strong-page programming procedure at the beginning (step S806). The weak-page programming procedure then follows (step S808). In addition, after all programming procedures are done (step S806 and step S808), the control flow starts to receive writing data transmitted from the host (step S802).

According to the disclosure, when the voltage detecting unit 603 detects that the supply voltage (Vs) is lower than the predetermined voltage (Vdet), all data-for-storage are programmed to the blank area of the flash memory by the strong-page programming procedure (step S810). In other words, when the control unit 601 confirms that the supply voltage (Vs) provided by the power supply system is lower than the predetermined voltage (Vdet), the control unit 601 starts to execute an emergent programming operation. The emergent programming operation may occur when the power supply system fails. The emergent programming operation may also occur when the supply voltage (Vs) provided by the power supply system is unstable, or lower than the predetermined voltage (Vdet). With the emergent programming operation, the control unit 601 efficiently and securely stores all the data-for-storage to the multi-level cell flash memory 605.

Take FIG. 7 as an example, during time point t1 to time point t2, the data-for-storage are stored to the multi-level cell flash memory 605 before the supply voltage (Vs) drops to the minimum voltage (Vmin).

The programming time for the strong-page is the shortest. Therefore, the present disclosure programs the data-for-storage to the blank area by the strong-page programming procedure. Via the strong-page programming procedure, duration for programming all data-for-storage to the blank area is the shortest. Moreover, after the strong-page programming procedure, only two storage states can be distinguished for each memory cell in the blank area. Therefore, more blank area is required for programming the data-for-storage.

The double-level cell flash memory is illustrated as an example below. Assuming that during the emergent procedure, two pages of data-for-storage are existed in the buffer unit 607. This implies that a blank area with size of [2×(4224×8)] is required by the control unit 601 for storing these two pages of data-for-storage. That is, the first page of the data-for-storage will be stored to the first 4224×8 memory cells by the strong-page programming process. Similarly, with the strong-page programming procedure, the second page of the data-for-storage will be stored to another 4224×8 memory cells. Therefore, the duration for programming two pages of data-for-storage needs only 2 ms (1 ms+1 ms).

As mentioned above, 3.5 ms (1 ms+2.5 ms) is required for the conventional solid state drive to store 2 pages of data to 4224×8 memory cells. With the emergent programming operation, duration of the total programming period has been shortened largely.

Based on above illustrations, a data storage method for the solid state drive encountering power failure is provided in the disclosure. The solid state drive executes the emergent programming operation when the supply voltage provided by the power supply system is not sufficient (lower than the predetermined voltage). In the meanwhile, the control unit 601 only executes strong-page programming procedure and correspondingly stores all data-for-storage in the buffer unit 607 to the blank area of the multi-level cell memory. Therefore, the disclosure rapidly programs data-for-storage to the multi-level cell flash memory even when the supply voltage is low, or when the power supply system fails. By doing so, the complete programming duration is minimized. In addition, this approach solves the problem that data-for-storage is missing when the supply voltage fails.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state drive, electrically connected to a host, comprising:
   a control unit, for receiving data-for-writing from the host, and transforming the data-for-writing to data-for-storage;
   a buffer unit, for storing the data-for-storage;
   a multi-level cell flash memory, electrically connected to the control unit; and
   a voltage detecting unit, for receiving a supply voltage, and issuing an informing signal when the supply voltage is lower than a predetermined voltage, wherein the control unit proceeds a strong-page programming procedure for storing the data-for-storage to a blank area of the multi-level cell flash memory after receiving the informing signal.

2. The solid state drive as claimed in claim 1, wherein the control unit sequentially proceeds the strong-page programming procedure and a weak-page programming procedure for storing the data-for-storage to the multi-level cell flash memory when the informing signal is not received by the control unit.

3. The solid state drive as claimed in claim 1, wherein the multi-level cell flash memory is a double-level cell flash memory, a triple-level cell flash memory, or a quadruple-level cell flash memory.

4. The solid state drive as claimed in claim 1, wherein each memory cell of the blank area consists of two storage states after the strong-page programming procedure.

5. A data storage method for a solid state drive, the data storage method comprising steps of:
  receiving data-for-writing from a host, and transforming the data-for-writing to data-for-storage;
  comparing a supply voltage and a predetermined voltage; and
  when the supply voltage is lower than the predetermined voltage, proceeding a strong-page programming procedure for storing the data-for-storage to a blank area of a multi-level cell flash memory.

6. The data storage method as claimed in claim 5, wherein the data storage method further comprising step of:
  when the supply voltage is not lower than the predetermined voltage, sequentially proceeding the strong-page programming procedure and a weak-page programming procedure for storing the data-for-storage to the multi-level cell flash memory.

7. The data storage method as claimed in claim 5, wherein the multi-level cell flash memory is a double-level cell flash memory, a triple-level cell flash memory, or a quadruple-level cell flash memory.

8. The data storage method as claimed in claim 5, wherein each memory cell of the blank area consists of two storage states after the strong-page programming procedure.

* * * * *